United States Patent
Kliman et al.

(10) Patent No.: US 6,927,597 B2
(45) Date of Patent: *Aug. 9, 2005

(54) DIRECT CURRENT MACHINE MONITORING SYSTEM AND METHOD

(75) Inventors: Gerald Burt Kliman, Niskayuna, NY (US); Dongwoo Song, Latham, NY (US); Rudolph Alfred Albert Koegl, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 142 days.

This patent is subject to a terminal disclaimer.

(21) Appl. No.: 10/248,156

(22) Filed: Dec. 20, 2002

(65) Prior Publication Data

US 2004/0119493 A1 Jun. 24, 2004

(51) Int. Cl.[7] .............................................. G01R 31/34
(52) U.S. Cl. ................. 324/772; 324/76.19; 324/117 R
(58) Field of Search .......................... 324/76.22, 76.19, 324/512, 513, 520, 522, 117 R, 117, 117 H, 127, 545, 772, 166; 702/57–60, 106, 145, 146, 76–78, 81, 82; 318/490; 322/99

(56) References Cited

U.S. PATENT DOCUMENTS 6,496,782 B1    12/2002  Claus et al. ................... 702/40
6,507,797 B1 *  1/2003   Kliman et al. ................ 702/75

* cited by examiner

Primary Examiner—Vinh Nguyen
Assistant Examiner—Jimmy Nguyen
(74) Attorney, Agent, or Firm—Paul J. DiConza; William E. Powell, III

(57) ABSTRACT

A direct current machine monitoring system includes a sensor configured to monitor a load current of the machine and provide a signal indicative of an alternating current component of the load current; and a computer configured for: transforming the signal to provide a time domain transformation of the alternating current component of the load current, identifying features in the time domain transformation corresponding to sparking, and assessing a condition of the direct current machine using the features. The transform may be performed using a wavelet transform. The features may be used to determine a sparking intensity and a sparking frequency in the direct current machine, which may be used to determine a sparking index for assessing the condition of the direct current machine. The sparking index may be compared to a limit value, and statistical analysis may be performed on the sparking index.

25 Claims, 5 Drawing Sheets

200~# DIRECT CURRENT MACHINE MONITORING SYSTEM AND METHOD

BACKGROUND OF THE INVENTION

The invention relates generally to direct current machines and more particularly to direct current machine monitoring systems.

A degraded commutator of a direct current (DC) machine will show excessive sparking as brushes bounce over the rough surface and the conduction period for a particular segment ends prematurely or as a winding remains shorted for too long by a spark region which extends between segments. Ultimately a short circuit will develop, through an extended spark region over the commutator bars, between opposite-polarity brushes. This condition is known as "flashover". Sparking can additionally be caused by factors such as worn down brushes, improper brush positioning, or load or supply problems, for example.

The principal mechanisms of brush wear are mechanical friction and sparking. Wear by friction is similar to friction wear in other mechanical systems. Frictional wear will be accelerated when the surface of the commutator is not smooth. Sparking will directly cause erosion by excessive local heating, field emission and other associated phenomena. Spark erosion also results in roughening of the commutator surface which further accelerates friction wear. A rough commutator then also causes increased sparking leading to accelerated brush wear and increasing commutator roughness so that the process feeds on itself.

The visual "sparking index" is a useful measure of commutation quality in DC motors. In the traditional method the number of sparking sites and their intensity on a single brush are visually observed and compared to a sample chart to get a rough estimate of severity. Using the chart, the sparking intensity is assigned a sparking index, which is a letter designation such as "A" for no sparking, "B" for minimal sparking, "C" for more sparking, and so on. Unfortunately, such visual observations are highly subjective, variable, and often times impractical due to viewing conditions or motor location.

On-line monitoring of commutation quality degradation as a measure of brush and/or commutator degradation or wear, for example, or as a precursor to flashover in DC machines can provide a significant advantage in steel mill, paper mill, and locomotive applications, for example, wherein visual inspection during operation is impractical. As described in Michael P. Treanor and Gerald B. Kliman, "INCIPIENT FAULT DETECTION IN LOCOMOTIVE DC TRACTION MOTORS," Proceedings of the 49$^{th}$ Meeting of the Society for Machinery Failure Prevention Technology, Virginia Beach, Va., April 1995, pp. 221–230, machine condition monitoring for poor commutation can be achieved by frequency-domain analysis of machine current at the frequency of bar passing. The bar-passing frequency can be determined by multiplying the number of commutator bars by the speed (rotation frequency) of the motor. The magnitude of the peak at the bar-passing frequency increased by a factor of at least two when the commutation quality was degraded by incorrectly aligning the brushes. To provide an unambiguous determination of the bar passing frequency, the speed of the motor needs to be obtained with sufficient certainty and precision, which can be made difficult due to speed variations.

BRIEF DESCRIPTION OF THE INVENTION

The above-described drawbacks and deficiencies are overcome or alleviated by a direct current machine monitoring system comprising: (a) a sensor for monitoring a load current of the machine to provide a signal indicative of an alternating current component of the load current; and (b) a computer configured for (i) transforming the signal to provide a time domain transformation of the alternating current component of the load current, (ii) identifying features in the time domain transformation, and (iii) assessing a condition of the direct current machine using the features. In one embodiment, the transform is performed using a wavelet transform.

In one aspect, the computer is configured for determining a sparking frequency of the direct current machine using the features, and determining a sparking intensity of the direct current machine using the features. The assessing is performed using the sparking frequency and the sparking intensity. In one aspect, the sparking intensity is determined by determining a magnitude of a feature in the time domain transformation. In another aspect, the sparking frequency is determined by determining a frequency of occurrence of a feature in the time domain transformation.

In another aspect, the assessing includes assigning a sparking index based on the sparking frequency and the sparking intensity. The assessing may further include comparing the sparking index to a limit value, and performing statistical analysis using the sparking index.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
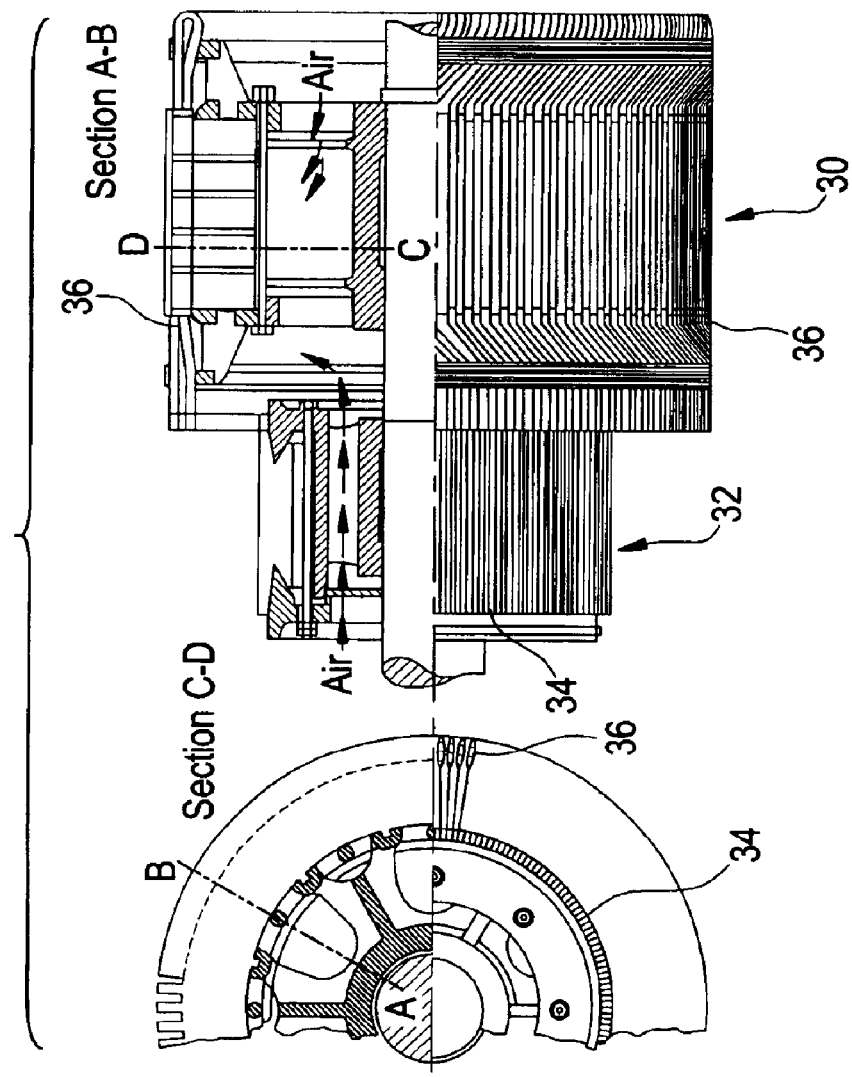
FIG. 1 includes partially cross-sectional axial and longitudinal views of a conventional DC machine commutator and armature.
Figure 2:
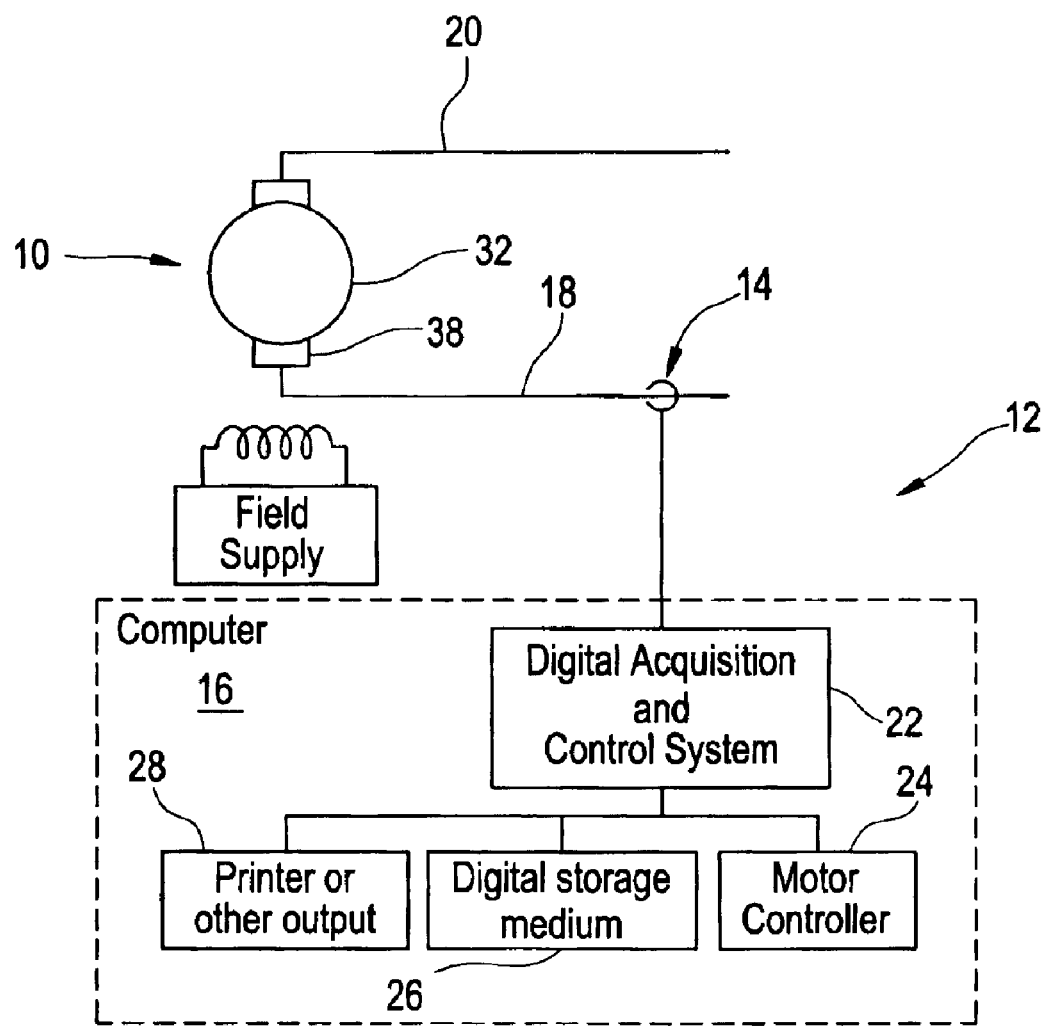
FIG. 2 is a block diagram of a monitoring system for a direct current machine which can be used in several embodiments of the present invention.

FIG. 1 includes partially cross-sectional axial and longitudinal views of a conventional DC machine commutator 32 and armature 30 such as is shown in Albert Still, ELEMENTS OF ELECTRICAL DESIGN, 2$^{nd}$ edition, 3$^{rd}$ impression, p 212 (1932), and FIG. 2 is a block diagram of a monitoring system for a direct current machine which can be used in several embodiments of the present invention.

In one embodiment of the present invention, a direct current machine 10 monitoring system 12 includes: (a) a sensor 14 for monitoring load current of the machine 10 to provide a signal indicative of an alternating current component of the load current; and (b) a computer 16 configured for (i) transforming the signal to provide a time domain transformation of the alternating current component of the load current, (ii) identifying features in the time domain transformation, and (iii) assessing a condition of the direct current machine 10 using the features.

Current sensor 14 comprises a sensor having an appropriate bandwidth. In particular, when used on large machines, the current sensor is designed so as not to be saturated by DC current. The load current of interest comprises the alternating current (AC) component of the current present in the power leads 18 and 20 of the DC machine. The AC component results from sparking, commutation action, varying mechanical loads or sources, and varying electrical loads or sources. A normally operating DC machine 10 displays peaks in the power spectrum of the load current (i.e., the linear spectrum of the current multiplied by its complex conjugate) corresponding to the frequency of rotation and to the frequency of the passing of commutator bars 34 (FIG. 1) under brushes 38 (FIG. 2).

Computer 16 may comprise an integral data processing unit or multiple separate data processing units. In the example of FIG. 2, computer 16 includes a digital acquisition and control system 22, a machine controller 24, a digital storage medium 26, and a printer or other output 28. In one embodiment, the computer 16 comprises a conventional machine controller with additional software that performs the functions of the present invention.

Figure 3:
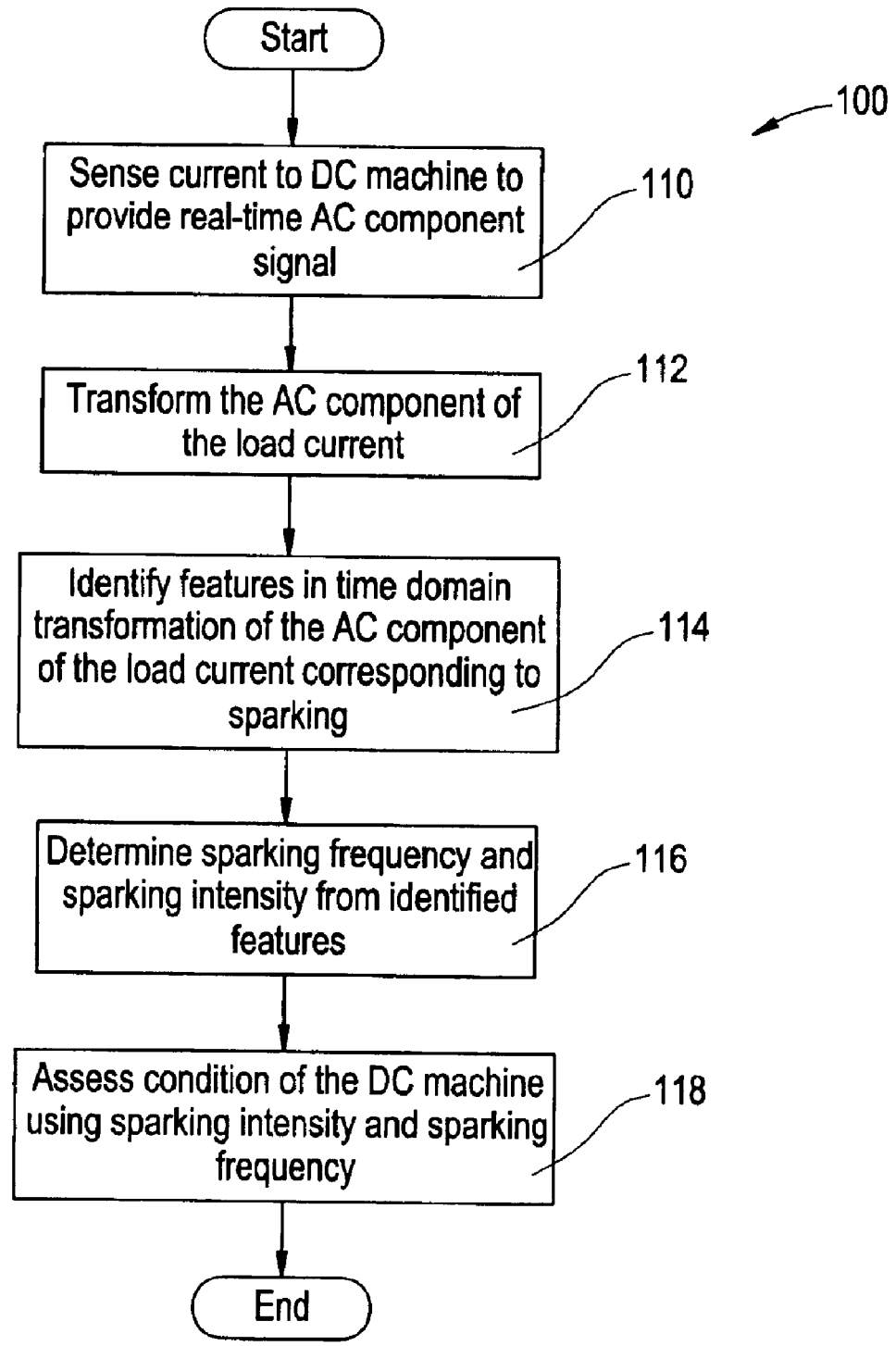
FIG. 3 is a flowchart of a process for machine monitoring in one embodiment of the present invention.

FIG. 3 is a flow chart illustrating one embodiment of a process 100 for monitoring direct current machine 10. Current sensor 14 provides a signal indicative of the alternating current (AC) component of the current present in the power leads 18 and 20 of the DC machine 10 (block 110). This signal is sampled by digital acquisition and control system 22, and the sampled signal is transformed to determine the time localization of the spectral components of the signal (block 112). The transformation used in this process may be of any type that provides a time domain transformation of the signal. Preferably, the transform used in the present invention is a wavelet transform; however, other transforms producing the time domain transformation of the signal may be used. The term "wavelet transform", as used herein, may include continuous wavelet transforms, discretized continuous wavelet transforms, and discrete wavelet transforms. These different transforms may be implemented in a series of filters, a series of steps performed by computer 16, or any combination thereof.

In an exemplary embodiment, a wavelet transform (WT) of the following form may be used:

$$WT = \int x(t) \Psi(\tau, a) dt \quad (1)$$

where $\tau$ is the translation parameter, a is the scale parameter, x(t) is the time-domain signal, and $\Psi(\tau, a)$ is the mother (analyzing) wavelet.

In the exemplary embodiment, the mother wavelet may be selected as:

$$\Psi(\tau, a) = \frac{e^{-(t-\tau)}}{\sqrt{a}} \sin\left(\frac{t-\tau}{a}\right) \quad (2)$$

However, it will be recognized that other mother wavelets may be selected for a particular application.

The translation parameter $\tau$ is related to the location of the wavelet (window) as the window is translated through the signal x(t). The scale parameter, "a", dilates or contracts the window for each pass through the signal x(t). In one embodiment, "a" is selected from values a=½, ¼, ⅛, with a=⅛ being preferred for the detection of sparking.

Figure 4:
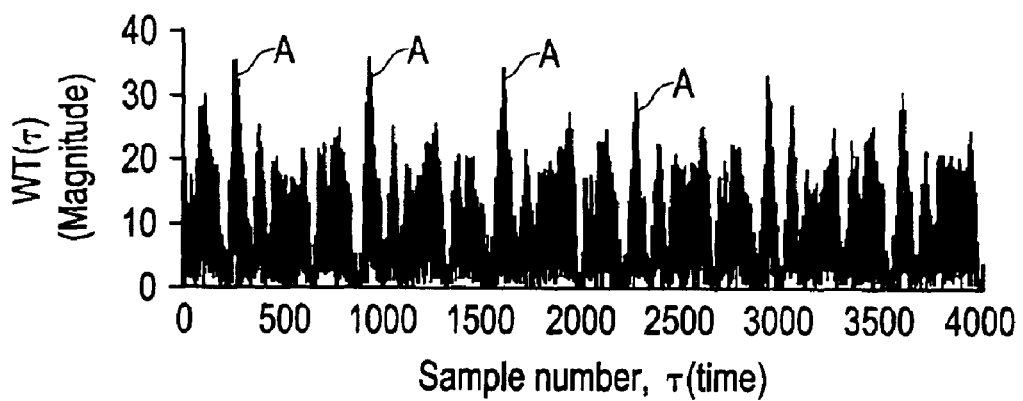
FIG. 4 is a graph depicting a time domain transformation of the load current as detected from a DC motor using the method of the present invention.

Transformation of the signal (block 112) is accomplished by computing WT for each translation parameter $\tau$, and then plotting WT as a function of sample number $\tau$ to provide the time domain transformation of the AC component of the load current. Referring to FIG. 4, a graph depicting a time domain transformation of the AC component of the load current for a ten horsepower, four brush motor is shown. In FIG. 4, the y-axis represents the square of the wavelet transform $(WT(\tau))^2$, while the x-axis represents sample number, $\tau$, which is associated with time by the signal sampling rate. While FIG. 4 shows the time domain transformation in a graphic form, it will be appreciated that the transformation may be in any form to facilitate human or computer analysis.

Referring to FIG. 3 and FIG. 4, using the time domain transformation, the features corresponding to sparking can be identified (block 114). This identification can be accomplished visually or computationally by identifying the peaks having a magnitude above a predetermined threshold. For example, as shown in FIG. 4, a repeating pattern of peaks A can be identified.

The predetermined threshold used in block 114 may be determined through calibration of the DC machine 10. For example, in a machine where sparking can be controlled by compole current (buck/boost), a buck/boost test can be performed to characterize the features of the time domain transformation that indicate sparking.

Once the features corresponding to sparking are identified (block 114), the sparking intensity and sparking frequency can be determined (block 116). The sparking intensity may be determined using the magnitude of the feature in the time domain transformation of the load current signal. For example, the sparking intensity may be equal to the magnitude of the feature. The sparking frequency can be determined as the number of peaks above the predetermined threshold per unit time. The sparking intensity in the motor can then be used along with the sparking frequency to assess the condition of the DC machine (block 118).

Figure 5:
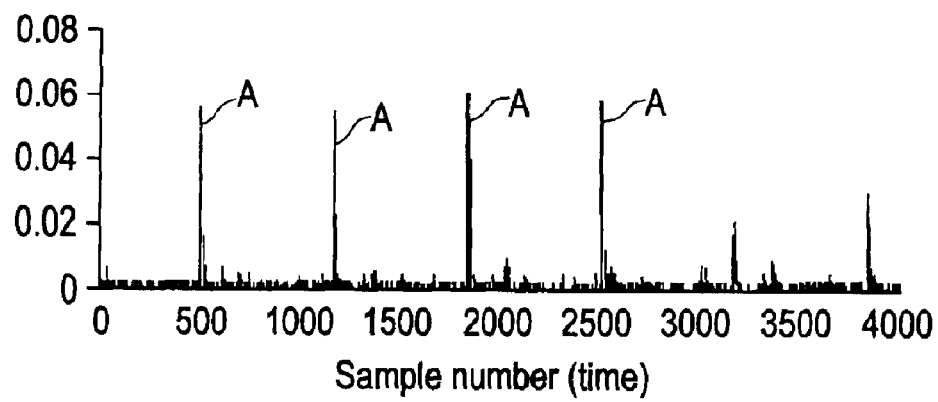
FIG. 5 is a graph depicting sparking intensity as a function of time as detected with an optical sensor.

Comparison of FIG. 4 and FIG. 5 reveals a correlation between the occurrence of sparking as recorded visually and as recorded remotely using the method of the present embodiment. FIG. 5 is a graph depicting the output of an optical sensor monitoring one of the four brushes in the ten horsepower motor. Data used in the generation of FIG. 4 and FIG. 5 were obtained simultaneously and show that the current pulses A indicated in FIG. 4 occur at a constant displacement in time after the optical pulses A in FIG. 5. This displacement may be due, at least in part, to a time shifting property of the wavelet transform. Accordingly, certain applications of the time domain spectrum may require that the time delay be accounted for.

Figure 6:
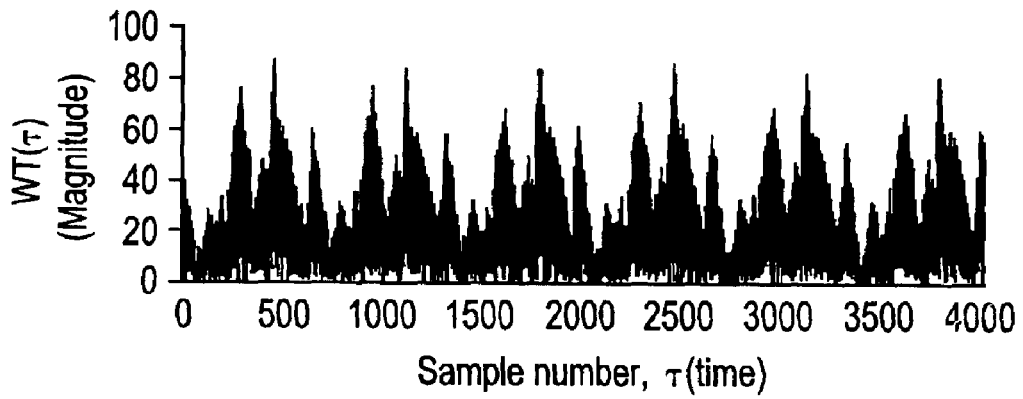
FIG. 6 is a graph depicting a time domain transformation of the load current indicating increased sparking intensity in the DC motor from that shown in FIG. 4.

Comparison of FIG. 4 and FIG. 6 reveals an example of an increase in sparking intensity in the DC motor due to increased brush mispositioning. Data for FIG. 6 was acquired from the same motor as used for FIG. 4, but with increased brush mispositioning so that sparking was intense. As can be seen, the increased brush mispositioning from FIG. 4 to FIG. 6 causes an increase in the magnitude of the peaks from FIG. 4 to FIG. 6.

Figure 7:
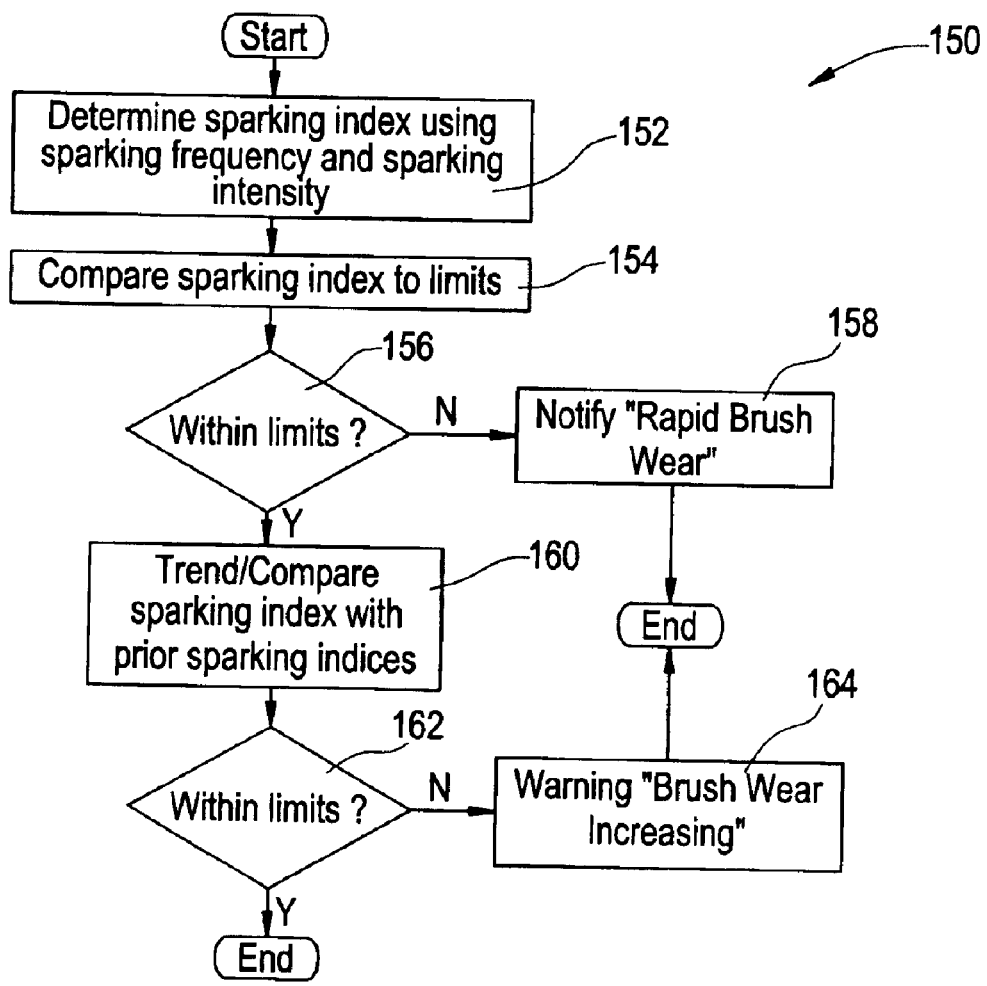
FIG. 7 is a flow chart of a process for assessing machine condition in one embodiment of the present invention.

Referring to FIG. 7, a process 150 for assessing machine condition, as may be applied in block 120 of FIG. 3, is shown. In process 150, the assessment of the DC machine is accomplished using a sparking index (block 152). The sparking index is a measure of commutation quality in DC motors in which sparking frequency and sparking intensity are applied to determine different levels of commutation quality. In one embodiment, the sparking index is calculated as a product of the sparking frequency and the sparking intensity. In another embodiment, the sparking index is a sum of the sparking intensities divided by the sparking frequency.

Assessment of the DC machine further includes statistical analysis using the sparking index. Such statistical analysis may include comparing the sparking index to predetermined limits for determining whether the sparking index is within an acceptable range (block 154). If the sparking index is not within the acceptable range (block 156), notification of rapid brush wear may be provided by computer 16 (block 158). The sparking index may also be trended and/or compared to sparking indices previously determined and stored in computer 16 for determining whether the sparking index is increasing over time (block 160). If the sparking indices are significantly increasing or otherwise outside predetermined limits (block 162), a warning that brush wear is increasing may be provided by computer 16 (block 164).

Because the system and method described herein employ a transform that provides a time domain spectrum of the AC component of the load current, sparking in the DC machine can be detected without adding sensors in the DC machine and without knowledge of the motor geometry and speed. This has been verified by comparison of the transformed current from a test motor with the output of a photocell looking at one of the four brushes in the test motor.

With the system and method of the present invention, the intensity of sparking can now be estimated in a manner more akin to the traditional sparking index method. That is, both the sparking frequency as well as the sparking intensity in the motor may be combined to yield a precise numerical "sparking index" that could be subjected to statistical analysis. With the present invention, the sparking index method can now be performed remotely, and in a less subjective manner than was previously possible.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A direct current machine monitoring system comprising:

(a) a sensor configured to monitor a load current of the machine and provide a signal indicative of an alternating current component of the load current; and (b) a computer configured for (i) transforming the load current to provide a time domain transformation of the alternating current component of the load current, (ii) identifying features in the time domain transformation corresponding to sparking, and (iii) assessing a condition of the direct current machine using the features.

2. The direct current machine monitoring system of claim 1, wherein the computer is further configured for:

determining a sparking frequency of the direct current machine using the features;

determining a sparking intensity of the direct current machine using the features; and wherein the assessing is performed using the sparking frequency and the sparking intensity.

3. The system of claim 2, wherein the determining the sparking intensity includes:

determining a magnitude of a feature in the time domain transformation.

4. The system of claim 2, wherein the determining the sparking frequency includes:

determining a frequency of occurrence of a feature in the time domain transformation.

5. The system of claim 2, wherein the assessing includes:

determining a sparking index based on the sparking frequency and the sparking intensity.

6. The system of claim 5, wherein the assessing further includes:

comparing the sparking index to a threshold value.

7. The system of claim 5, wherein the assessing further includes:

performing statistical analysis using the sparking index.

8. The system of claim 5, wherein the determining the sparking index includes at least one of:

multiplying the sparking frequency and sparking intensity; and dividing a sum of a plurality of sparking intensities by the sparking frequency.

9. The system of claim 1, wherein the transforming is performed using a wavelet transform.

10. A direct current machine monitoring system comprising:

(a) a sensor configured to monitor a load current of the machine and provide a signal indicative of an alternating current component of the load current; and (b) a computer configured for (i) transforming the signal using a wavelet transform to provide a time domain transformation of the signal, (ii) determining a magnitude of at least one feature in the time domain transformation of the signal to provide a sparking intensity, (iii) determining a frequency of occurrence of the at least one feature in the time domain transformation to provide a sparking frequency, and (v) assessing a condition of the direct current machine using the sparking intensity and the sparking frequency.

11. The system of claim 9, wherein the assessing includes:

determining a sparking index based on the sparking frequency and the sparking intensity.

12. The system of claim 11, wherein the assessing further includes:

comparing the sparking index to a threshold value.

13. The system of claim 11, wherein the assessing further includes:
    performing statistical analysis using the sparking index.

14. A method of monitoring a direct current machine, the method comprising:
    sensing a load current to the direct current machine to provide a signal indicative of an alternating current component of the load current;
    transforming the signal to provide a time domain transformation of the alternating current component of the load current;
    identifying features in the time domain transformation corresponding to sparking; and
    assessing a condition of the direct current machine using the features.

15. The method of claim 14, further comprising:
    determining a sparking frequency of the direct current machine using the features,
    determining a sparking intensity of the direct current machine using the features, and
    wherein the assessing is performed using the sparking frequency and the sparking intensity.

16. The method of claim 15, wherein the determining the sparking intensity includes:
    determining a magnitude of a feature in the time domain transformation.

17. The method of claim 15, wherein the determining the sparking frequency includes:
    determining a frequency of occurrence of a feature in the time domain transformation.

18. The method of claim 15, wherein the assessing includes:
    determining a sparking index based on the sparking frequency and the sparking intensity.

19. The method of claim 18, wherein the assessing further includes:
    comparing the sparking index to a threshold value.

20. The method of claim 18, wherein the assessing further includes:
    performing statistical analysis using the sparking index.

21. The method of claim 14, wherein the transforming is performed using a wavelet transform.

22. A method of monitoring a direct current machine, the method comprising:
    sensing a load current to the direct current machine to provide a signal indicative of an alternating current component of the sensed current;
    transforming the signal using a wavelet transform to provide a time domain transformation of the alternating current component of the sensed current;
    determining a magnitude of at least one feature in the time domain transformation to provide a sparking intensity,
    determining a frequency of occurrence of the at least one feature in the time domain transformation to provide a sparking frequency, and
    assessing a condition of the direct current machine using the sparking intensity and the sparking frequency.

23. The system of claim 22, wherein the assessing includes:
    assigning a sparking index based on the sparking frequency and the sparking intensity.

24. The system of claim 23, wherein the assessing further includes:
    comparing the sparking index to a limit value.

25. The system of claim 23, wherein the assessing further includes:
    performing statistical analysis using the sparking index.

* * * * *